(12) United States Patent
Oh et al.

(10) Patent No.: US 8,216,770 B2
(45) Date of Patent: Jul. 10, 2012

(54) RESIN COMPOSITION COMPRISING CARDO RESIN, METHOD FOR FORMING PATTERN USING THE RESIN COMPOSITION AND COLOR FILTER USING PATTERN FORMED BY THE METHOD

(75) Inventors: Hee Young Oh, Seoul-si (KR); Choun Woo Lee, Suwon-si (KR); Hye Kyoung Cho, Yongin-si (KR); Ju Kwang Park, Siheung-si (KR); Cheon Seok Lee, Seongnam-si (KR)

(73) Assignee: Cheil Industries Inc., Gumi-si (KR)

( * ) Notice: Subject to any disclaimer, the term of this patent is extended or adjusted under 35 U.S.C. 154(b) by 1363 days.

(21) Appl. No.: 11/747,313

(22) Filed: May 11, 2007

(65) Prior Publication Data

US 2008/0090177 A1    Apr. 17, 2008

(30) Foreign Application Priority Data

Oct. 16, 2006   (KR) .................. 10-2006-0100167

(51) Int. Cl.
*G03C 1/40* (2006.01)
*G03C 1/10* (2006.01)

(52) U.S. Cl. ............... 430/280.1; 430/270.1; 430/286.1

(58) Field of Classification Search ............... 430/280.1, 430/270.1, 286.1
See application file for complete search history.

(56) References Cited

U.S. PATENT DOCUMENTS 4,500,897 A    2/1985   Matsuda et al.
(Continued)

FOREIGN PATENT DOCUMENTS

CN           1606597       4/2005
(Continued)

OTHER PUBLICATIONS

Taiwanese Office Action in commonly owned Taiwanese Application No. 095144145 dated Jun. 4, 2010.

(Continued)

*Primary Examiner* — Robert D. Harlan
(74) *Attorney, Agent, or Firm* — Summa, Additon & Ashe, P.A.

(57) ABSTRACT

Disclosed is a resin composition including a cardo resin. Exemplary resin compositions can include (a) a cardo resin having a structural unit represented by Formula 1, (b) a reactive unsaturated compound, (c) an initiator, and (d) a solvent, (1)

wherein each $R_1$ and $R_2$ is independently a hydrogen atom, a halogen atom or a $C_1$-$C_5$ alkyl group, $R_3$ is a vinyl, acryl or methacryl group, Z represents the residue of an acid anhydride or dianhydride, X is —CO—, —SO$_2$—, —C(CF$_3$)$_2$—, —Si(CH$_3$)$_2$—, —CH$_2$—, —C(CH$_3$)$_2$—, —O—, ($R_4$=H, Et, $C_2H_4Cl$, $C_2H_4OH$, $CH_2CH$=$CH_2$ or Ph), and k is integer from 1 to 40.

Further disclosed is a color filter which includes a fine pattern formed using the composition. The color filter can exhibit superior resistance to heat and chemicals, improved developability, and good adhesiveness.

17 Claims, No Drawings

U.S. PATENT DOCUMENTS

| | | | |
|---|---|---|---|
| 4,762,752 | A | 8/1988 | Haubennestel et al. |
| 5,424,167 | A | 6/1995 | Uetani et al. |
| 5,707,432 | A | 1/1998 | Adams et al. |
| 5,708,055 | A | 1/1998 | Joyce et al. |
| 5,710,234 | A | 1/1998 | Fujishiro et al. |
| 5,721,076 | A * | 2/1998 | Watanabe et al. .............. 430/7 |
| 5,803,959 | A | 9/1998 | Johnson et al. |
| 5,851,280 | A | 12/1998 | Belmont et al. |
| 5,895,522 | A | 4/1999 | Belmont et al. |
| 5,922,118 | A | 7/1999 | Johnson et al. |
| 5,968,243 | A | 10/1999 | Belmont et al. |
| 6,110,994 | A | 8/2000 | Cooke et al. |
| 6,232,025 | B1 | 5/2001 | Srinivasan |
| 6,277,183 | B1 | 8/2001 | Johnson et al. |
| 6,328,894 | B1 | 12/2001 | Chan et al. |
| 6,780,389 | B2 | 8/2004 | Karl et al. |
| 6,960,250 | B2 | 11/2005 | Luethge et al. |
| 7,132,154 | B2 | 11/2006 | Shibahara et al. |
| 7,250,209 | B2 | 7/2007 | Shibahara et al. |
| 7,376,328 | B2 | 5/2008 | Takase et al. |
| 7,592,119 | B2 | 9/2009 | Nomura |
| 7,794,917 | B2 | 9/2010 | Mori et al. |
| 2002/0187412 | A1 | 12/2002 | You et al. |
| 2004/0126592 | A1 | 7/2004 | Shibahara et al. |
| 2005/0164120 | A1 | 7/2005 | Yamaoka et al. |
| 2006/0041053 | A1 | 2/2006 | Kamata et al. |
| 2007/0101903 | A1* | 5/2007 | Lee et al. ............... 106/476 |
| 2007/0161110 | A1 | 7/2007 | Iida et al. |
| 2008/0090177 | A1 | 4/2008 | Oh et al. |
| 2009/0207490 | A1 | 8/2009 | Moriyama et al. |
| 2010/0085518 | A1 | 4/2010 | Choi et al. |
| 2010/0163811 | A1 | 7/2010 | Oh et al. |
| 2010/0227178 | A1 | 9/2010 | Ooushi et al. |

FOREIGN PATENT DOCUMENTS

| | | |
|---|---|---|
| CN | 1606600 | 4/2005 |
| EP | 1471112 A1 | 10/2004 |
| JP | 60237403 | 11/1985 |
| JP | 1152449 | 6/1989 |
| JP | 1200353 | 8/1989 |
| JP | 4007373 | 1/1992 |
| JP | 4091173 | 3/1992 |
| JP | 4163552 | 6/1992 |
| JP | 05-339356 A | 12/1993 |
| JP | 06-001938 A | 1/1994 |
| JP | 07-064281 A | 3/1995 |
| JP | 07-064282 A | 3/1995 |
| JP | 08-278630 A | 10/1996 |
| JP | 09-022653 A | 1/1997 |
| JP | 09-291224 | 11/1997 |
| JP | 09-304929 | 11/1997 |
| JP | 10-010311 A | 1/1998 |
| JP | 10-067970 | 3/1998 |
| JP | 10-204321 A | 8/1998 |
| JP | 10218973 | 8/1998 |
| JP | 10-253820 A | 9/1998 |
| JP | 10-510861 | 10/1998 |
| JP | 11-060989 A | 3/1999 |
| JP | 11231523 A | 8/1999 |
| JP | 2000-056120 | 2/2000 |
| JP | 2000-171969 A | 6/2000 |
| JP | 2001-131241 | 5/2001 |
| JP | 2002-145999 | 5/2002 |
| JP | 3287661 B2 | 6/2002 |
| JP | 2003-066597 | 3/2003 |
| JP | 2003-149810 | 5/2003 |
| JP | 2004-004762 A | 1/2004 |
| JP | 2004-029745 A | 1/2004 |
| JP | 2004-186227 | 7/2004 |
| JP | 2004-198717 A | 7/2004 |
| JP | 2004-251946 A | 9/2004 |
| JP | 2004-292672 A | 10/2004 |
| JP | 2004-075985 A | 11/2004 |
| JP | 2005-215149 | 8/2005 |
| KR | 1019910004717 B1 | 7/1991 |
| KR | 1019920005780 B1 | 7/1992 |
| KR | 1019940005617 B1 | 6/1994 |
| KR | 94-7778 | 8/1994 |
| KR | 10-1995-7002313 | 6/1995 |
| KR | 95-11163 | 9/1995 |
| KR | 95-703746 | 9/1995 |
| KR | 96-11513 | 1/1999 |
| KR | 93-700858 | 7/2000 |
| KR | 10-0264691 | 9/2000 |
| KR | 95-700359 | 1/2001 |
| KR | 92-702502 | 12/2002 |
| KR | 2003-057090 | 7/2003 |
| KR | 96-29904 | 5/2004 |
| KR | 10-2006-0041154 A | 5/2006 |
| KR | 2006-70772 A | 6/2006 |
| KR | 10-2006-0076412 A | 7/2006 |
| KR | 10-0725023 B1 | 5/2007 |
| KR | 10-2009-0026037 A | 3/2009 |
| KR | 10-2010-0047648 A | 5/2010 |
| KR | 10-2010-0053090 A | 5/2010 |
| KR | 10-2010-0053476 A | 5/2010 |
| WO | 2004/055597 A1 | 7/2004 |
| WO | 2006/044676 A2 | 4/2006 |
| WO | 2008047992 A1 | 4/2008 |
| WO | 2010/050650 A1 | 5/2010 |

OTHER PUBLICATIONS

English translation of Taiwanese Search Report in commonly owned Taiwanese Application No. 095144145 dated May 11, 2010.
Office Action in commonly owned U.S. Appl. No. 12/323,554 mailed Dec. 29, 2009.
International Search Report in counterpart International Application No. PCT/KR2007/002908, dated Sep. 21, 2007.
English Translation of Abstract for Korean Patent Application 92-702502.
English Translation of Abstract for Korean Patent Application 93-700858.
English Translation of Abstract for Korean Patent Application 94-7778.
English Translation of Abstract for Korean Patent Application 95-11163.
English Translation of Abstract for Korean Patent Application 95-700359.
English Translation of Abstract for Korean Patent Application 95-703746.
English Translation of Abstract for Korean Patent Application 96-11513.
English Translation of Abstract for Korean Patent Application 96-29904.
Machine Translation of JP 07064282 A.
Machine Translation of KR 2003057090 A.
Office Action in commonly owned copending U.S. Appl. No. 12/323,554, mailed on Jun. 24, 2009.
English abstract of JP 2004-292672, published Oct. 21, 2004.
English abstract of JP 10-204321, published Aug. 4, 1998.
English abstract of JP 2004-251946, published Sep. 9, 2004.
English abstract of JP 2004-029745, published Jan. 29, 2004.
English abstract of JP 2004-004762, published Jan. 8, 2004.
English abstract of JP 2004-075985, published Mar. 11, 2004.
English abstract of JP 2004-198717, published Jul. 15, 2004.
English abstract of JP 10-253820, published Sep. 25, 1998.
English abstract of JP 10-010311, published Jan. 16, 1998.
English abstract of JP 11-060989, published Mar. 5, 1999.
English abstract of JP 09-022653, published Jan. 21, 1997.
Office Action in commonly owned U.S. Appl. No. 11/473,876 mailed on Dec. 18, 2008, pp. 1-17.
Notice of Allowance in commonly owned U.S. Appl. No. 11/473,876 mailed on Jul. 17, 2009, pp. 1-6.
Office Action in commonly owned U.S. Appl. No. 12/504,409 mailed on Nov. 18, 2010, pp. 1-12.
Office Action in commonly owned U.S. Appl. No. 13/217,581 mailed Jan. 6, 2012, pp. 1-16.
Office Action in commonly owned U.S. Appl. No. 13/161,542 mailed Jan. 6, 2012, pp. 1-14.
Office Action in commonly owned U.S. Appl. No. 13/241,434 mailed Jan. 23, 2012, pp. 1-19.

* cited by examiner

RESIN COMPOSITION COMPRISING CARDO RESIN, METHOD FOR FORMING PATTERN USING THE RESIN COMPOSITION AND COLOR FILTER USING PATTERN FORMED BY THE METHOD

CROSS REFERENCE TO RELATED APPLICATIONS

This application claims priority from Korean Patent Application No. 10-2006-0100167, filed Oct. 16, 2006, which is hereby incorporated by reference in its entirety.

FIELD OF THE INVENTION

The present invention relates to a photosensitive resin composition useful for a color filter and a color filter produced using the resin composition.

BACKGROUND OF THE INVENTION

Liquid crystal display devices possess several advantages. Liquid crystal display devices can be light weight and have a relatively small thickness. Such devices can also be inexpensive, exhibit low-power consumption driving and can be compatible with integrated circuits. Because of these and other advantageous properties, liquid crystal display devices are currently used in notebooks, personal digital assistants (PDAs), cell phones and color televisions.

A liquid crystal display device typically includes a color filter array as a lower substrate and a TFT array as an upper substrate. The lower substrate can include a black matrix, a color filter and an ITO pixel electrode, and the upper substrate can include an active circuit portion composed of a liquid crystal layer, a thin film transistor and a capacitor layer and an ITO pixel electrode.

The color filter can be produced by forming red, green and blue pixels and a black matrix on a glass substrate, wherein the pixels and the black matrix are formed using photosensitive resin compositions comprising fine pigment particles dispersed therein. The black matrix plays a role in blocking uncontrolled light that is transmitted through the elements other than the transparent pixel electrodes of the respective substrates to prevent a reduction in contrast caused by light passing through the thin film transistor. The primary role of the red, green and blue pigment layers is to transmit light of a particular wavelength from white light, thereby creating these respective colors.

Generally, color filters are produced by dyeing, printing, pigment dispersion, electrodeposition, and other processes.

In a dyeing process, a color filter is produced by forming a black matrix on a glass substrate, applying a photosensitive solution, which is prepared by sensitizing a natural photosensitive resin (e.g., gelatin) or a synthetic photosensitive resin (e.g., an amine-modified polyvinyl alcohol or amine-modified acrylic acid) with dichromic acid, exposing the photosensitive solution to light through a photomask, followed by developing or dyeing with a masking coat and an acidic dye. The dyeing process, however, uses a number of colors on one substrate, which requires a resist dyeing process whenever colors are changed. This resist dyeing process can complicate and lengthen the time required for the overall procedure. Further, although dyes and resins commonly used for the dyeing process have good dispersibility and high visibility, they can have poor resistance to light, moisture and heat. Heat resistance of dyes and resins is an important property of color filters.

Korean Patent Publication Nos. 91-4717 and 94-7778 are directed to the use of an azo compound and an azide compound as dyes, respectively. However, these dyes have the disadvantages of poor heat resistance and low durability as compared to pigments.

In a printing process, a color filter is produced by printing using an ink, which is prepared by dispersing a pigment in a thermosetting or photocurable resin, and curing the printed ink with heat or light. Accordingly, printing processes can be economically advantageous in terms of material costs when compared to other processes. Printing processes, however, can also require the accurate alignment of three-color filter patterns, which can make it difficult to form precise and fine images and can result in the formation of a non-uniform thin film layer.

Examples of methods for producing color filters using an ink-jet technique are set forth in Korean Patent Laid-open Nos. 95-703746 and 96-11513. However, these methods use dye-type color resist compositions which are sprayed through a nozzle to print fine and accurate colors. Thus these methods have the disadvantages of low durability and poor heat resistance as in dyeing processes.

Korean Patent Laid-open Nos. 93-700858 and 96-29904 are directed to methods for producing color filters using electrodeposition. Electrodeposition can be employed to form a precise pigmented network. Electrodeposition processes can be advantageous because a pigment is used, which can exhibit desirable heat and light resistance. However, as the size of pixels decreases and electrode patterns becomes finer, electrodeposition processes can form colored speckles as a result of an electrical resistance at both ends of the pattern, or can increase the thickness of colored films, thus limiting the use of electrodeposition to the production of color filters requiring a high degree of precision.

In a pigment dispersion process, a color filter is produced by coating a photopolymerizable composition comprising a pigment on a transparent substrate, exposing the coated substrate to light to obtain a desired pattern, stripping the unexposed portion using a solvent, thermally curing the exposed portion, and repeating the process. Advantages of pigment dispersion processes include improved heat resistance, an important property of color filters, high durability and uniform film thickness.

Because of these advantages, pigment dispersion processes are widely used for the production of black matrices. For example, Korean Patent Laid-open Nos. 92-702502 and 95-700359 and Korean Patent Publication Nos. 94-5617 and 95-11163 are directed to processes for producing color resists using pigment dispersion.

A black matrix produced by a pigment dispersion process can be essentially composed of the following components: i) a polymeric compound (i.e. a binder resin) that acts as a support and maintains a constant thickness, and ii) a photopolymerizable monomer that responds to light upon exposure to form a photoresist phase. A black matrix can also be produced using a photosensitive resin composition comprising a polymeric compound, a photopolymerizable monomer, a pigment dispersion, a polymerization initiator, an epoxy resin, a solvent, and other additives. Various binder resins can be used for pigment dispersion processes, including a polyimide resin (Japanese Unexamined Patent Publication No. Sho 60-237403), photosensitive resins composed of an acrylic polymer (Japanese Unexamined Patent Publication Nos. Hei 1-200353, Hei 4-7373 and Hei 4-91173), a radical polymerization type photosensitive resin composed of an acrylate monomer, an organic polymeric binder and a photopolymerization initiator (Japanese Unexamined Patent Publication No. Hei 1-152449), and photosensitive resins composed of a phenolic resin, a crosslinking agent having an N-methylol structure and a photoacid generator (Japanese Unexamined Patent Publication No. Hei 4-163552 and Korean Patent Publication No. 92-5780).

However, although the use of a photosensitive polyimide resin or a phenolic resin as a binder resin in a pigment dispersion process can be advantageous in terms of high heat resistance, such binders can suffer from the drawbacks of low sensitivity and development with an organic solvent. Further, conventional systems using an azide compound as a photosensitizer can offer the problems of low sensitivity, poor heat resistance and attack by oxygen upon exposure.

To solve these problems, formation of an oxygen barrier film and exposure to an inert gas can be considered. However, these additional steps require complicated processing and incur increased equipment expense. Although a photosensitive resin forming images using an acid generated upon exposure is highly sensitive and is not attacked by oxygen upon exposure, heating is necessitated in the course of exposure and development steps and formation of a pattern is highly dependant on heating time, which makes the management of the processing difficult.

SUMMARY OF THE INVENTION

The present invention is directed to a resin composition including a cardo resin, which can be useful in the production of a color filter. Color filters produced using the resin composition of the invention can exhibit excellent physical properties (e.g., high resolution, good adhesiveness and high film strength) and high reliability in terms of heat resistance, light resistance, chemical resistance, transparency and stability over time.

The present invention can further provide a resin composition useful for a color filter which can include a cardo resin, a photopolymerizable or thermally polymerizable unsaturated compound, a photopolymerization initiator, a sensitizer or a radical polymerization initiator, a solvent, and optionally a pigment and/or at least one additive in a predetermined ratio, a method for preparing a material for a color filter using the resin composition, and a color filter including a material prepared by the method. The resin compositions of the invention can be an alkali-developable photosensitive or thermally curable composition.

The resin composition of the invention can include a cardo resin having a structural unit represented by Formula 1:

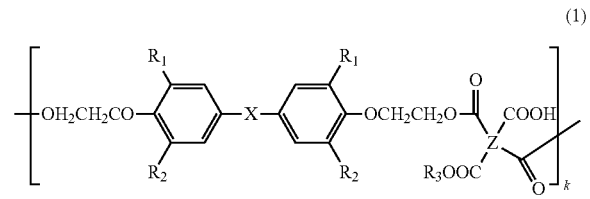

wherein each $R_1$ and $R_2$ is independently a hydrogen atom, a halogen atom or a $C_1$-$C_5$ alkyl group, $R_3$ is a vinyl, acryl or methacryl group, Z represents the residue of an acid anhydride or dianhydride, X is —CO—, —SO$_2$—, —C(CF$_3$)$_2$—, —Si(CH$_3$)$_2$—, —CH$_2$—, —C(CH$_3$)$_2$—, —O—,

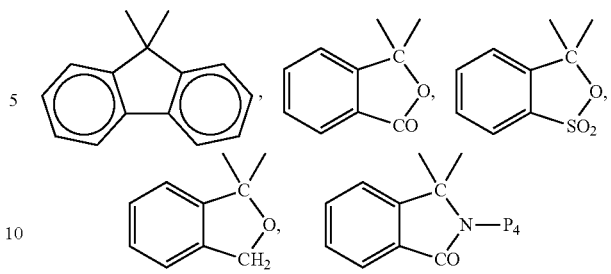

(in which $R_4$ is H, Et, $C_2H_4Cl$, $C_2H_4OH$, $CH_2CH$=$CH_2$ or Ph),

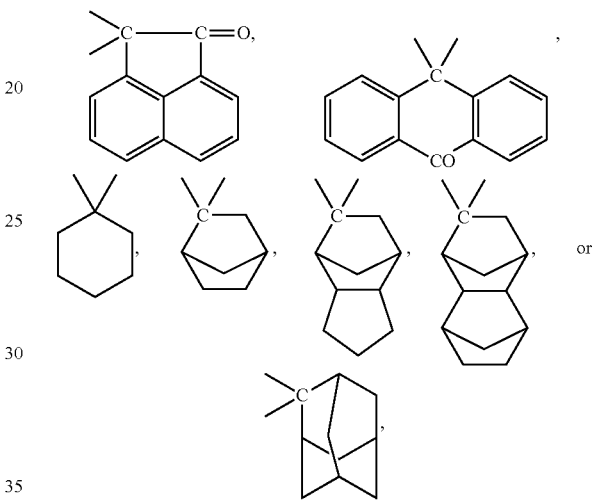

and k is integer from 1 to 40.

The cardo resin can have a molecular weight ($M_w$) ranging from about 3,000 to about 20,000.

The resin composition can include (a) about 1 to about 30% by weight of the cardo resin, (b) about 1 to about 30% by weight of a reactive unsaturated compound, (c) about 0.1 to about 10% by weight of an initiator, and (d) the balance a solvent.

The present invention can also provide a method for preparing a material for a color filter. The method of the invention can include the steps of:

(a) applying the resin composition to a thickness of about 0.5 to about 10 μm to a substrate;

(b) irradiating the resin composition with UV rays or X rays having a wavelength in the range of about 190 nm to about 450 nm to form a coating film; and (c) treating the coating film with a developing solution to form a pattern.

The present invention can also provide a color filter that can include a pattern material prepared using the resin composition.

DESCRIPTION OF THE PREFERRED EMBODIMENTS

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

Exemplary cardo resins having the structural unit represented by Formula 1 useful in the present invention include, without limitation, 3,3-bis(4-hydroxyphenyl)-2-benzofuran-1(3H)-one, 3,3-bis(4-hydroxy-3-methylphenyl)-2-benzofuran-1(3H)-one, 3,3-bis(4-hydroxy-2,5-dimethylphenyl)-2-benzofuran-1(3H)-one, 3,3-bis(4-hydroxy-1-naphthyl)-2-benzofuran-1(3H)-one, 3,3-bis(4-hydroxy-5-isopropyl-2-methylphenyl)-2-benzofuran-1(3H)-one, 3,3-bis(3,5-dibromo-4-hydroxyphenyl)-2-benzofuran-1(3H)-one, 3,3-bis(4-hydroxy-3,5-diiodophenyl)-2-benzofuran-1(3H)-one, 9,9-bis(4-hydroxyphenyl)-10-anthrone, 1,2-bis(4-carboxyphenyl)carborane, 1,7-bis(4-carboxyphenyl)carborane, 2-bis(4-carboxyphenyl)-N-phenylphthalimidine, 3,3-bis(4'-carboxyphenyl)phthalide, 9,10-bis-(4-aminophenyl)-anthracene, anthrone dianiline, aniline phthalein, and the like, and mixtures thereof. These cardo resins can be prepared from the following compounds: bis(4-hydroxyphenyl)sulfone, bis(4-hydroxy-3,5-dimethylphenyl)sulfone, bis(4-hydroxy-3,5-dichlorophenyl)sulfone, bis(4-hydroxyphenyl)hexafluoropropane, bis(4-hydroxy-3,5-dimethylphenyl)hexafluoropropane, bis(4-hydroxy-3,5-dichlorophenyl)hexafluoropropane, bis(4-hydroxyphenyl)dimethylsilane, bis(4-hydroxy-3,5-dimethylphenyl)dimethylsilane, bis(4-hydroxy-3,5-dichlorophenyl)dimethylsilane, bis(4-hydroxyphenyl)methane, bis(4-hydroxy-3,5-dichlorophenyl)methane, bis(4-hydroxy-3,5-dibromophenyl)methane, 2,2-bis(4-hydroxyphenyl)propane, 2,2-bis(4-hydroxy-3,5-dimethylphenyl)propane, 2,2-bis(4-hydroxy-3,5-dichlorophenyl)propane, 2,2-bis(4-hydroxy-3-methylphenyl)propane, 2,2-bis(4-hydroxy-3-chlorophenyl)propane, bis(4-hydroxyphenyl)ether, bis(4-hydroxy-3,5-dimethylphenyl)ether, bis(4-hydroxy-3,5-dichlorophenyl)ether, 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene, and the like, and mixtures thereof.

Z in Formula 1 represents the residue of an acid anhydride or dianhydride. Examples of suitable acid anhydride compounds useful in the present invention include, without limitation, methylendomethylenetetrahydrophthalic anhydride, chlorendic anhydride, methyltetrahydrophthalic anhydride, and the like, and mixtures thereof. Examples of suitable acid dianhydride compounds useful in the present invention include, without limitation, aromatic polycarboxylic anhydrides, such as pyromellitic anhydride, benzophenonetetracarboxylic dianhydride, biphenyltetracarboxylic dianhydride, biphenylethertetracarboxylic dianhydride, and the like, and mixtures thereof.

A cardo resin having a structural unit represented by Formula 1 can be highly compatible with other additives, and thus can prevent the occurrence of shock resulting from such additives and further can improve the adhesiveness and film strength of the final color filter. In addition, because the cardo resin has superior resistance to heat and light, it can be processed at high temperatures.

The cardo resin can be present in the composition in an amount of about 1 to about 30% by weight, for example, about 2 to about 10% by weight, based on the total weight of the resin composition. When the cardo resin is present in an amount of less than about 1% by weight, there may be a problem in the adhesion of a pattern. Meanwhile, when the cardo resin is present in an amount of more than about 30% by weight, there may be a problem in terms of sensitivity.

The cardo resin can have a weight average molecular weight ($M_w$) of about 3,000 to about 20,000, for example, about 5,000 to about 10,000.

The reactive unsaturated compound can be a monomer or oligomer that is generally used in thermally curable or photocurable resin compositions, and examples thereof suitable for the present invention include, without limitation, ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenol A diacrylate, trimethylolpropane triacrylate, novolac epoxy acrylate, ethylene glycol dimethacrylate, diethylene glycol dimethacrylate, triethylene glycol dimethacrylate, propylene glycol dimethacrylate, 1,4-butanediol dimethacrylate, 1,6-hexanediol dimethacrylate, and the like. These compounds may be used alone or as a mixture thereof.

The reactive unsaturated compound can be present in the composition in an amount of about 1 to about 30% by weight, based on the total weight of the resin composition. When the reactive unsaturated compound is present in an amount of less than about 1% by weight, sufficient curing may not occur after formation of a pattern, resulting in low reliability. Meanwhile, when the reactive unsaturated compound is present in an amount exceeding about 30% by weight, there may be problems in terms of resolution and adhesiveness. The reactive unsaturated compound can be treated with an acid anhydride in order to be readily dissolved in an aqueous alkaline solution The initiator used in the present invention may be one selected from the group consisting of photopolymerization initiators, radical polymerization initiators, and mixtures thereof.

Exemplary photopolymerization initiators useful in the present invention can include, without limitation, acetophenone compounds, benzophenone compounds, thioxanthone compounds, benzoin compounds, triazine compounds, and the like and mixtures thereof.

Examples of suitable acetophenone compounds can include, without limitation, 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and mixtures thereof.

Examples of suitable benzophenone compounds can include, without limitation, benzophenone, 4,4'-dimethylaminobenzophenone, 4,4'-dichlorobenzophenone, 3,3'-dimethyl-2-methoxybenzophenone, benzoylbenzoate, methyl benzoylbenzoate, 4-phenylbenzophenone, hydroxybenzophenone, acrylated benzophenone, 4,4'-bis(dimethylamino)benzophenone, 4,4'-bis(diethylamino)benzophenone, and the like, and mixtures thereof.

Examples of suitable thioxanthone compounds can include, without limitation, thioxanthone, 2-chlorothioxanthone, 2-methylthioxanthone, isopropylthioxanthone, 2,4-diethylthioxanthone, 2,4-diisopropylthioxanthone, 2-chlorothioxanthone, and the like, and mixtures thereof.

Examples of suitable benzoin compounds can include, without limitation, benzoin, benzoin methyl ether, benzoin ethyl ether, benzoin isopropyl ether, benzoin isobutyl ether, benzyl dimethyl ketal, and the like, and mixtures thereof.

Examples of suitable triazine compounds can include, without limitation, 2,4,6-trichloro-s-triazine, 2-(4'-ethylphenyl)-4,6-bis(trichloromethyl)-s-triazine, 2-(4'-n-butylphenyl)-4,6-bis(trichloromethyl)-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-styryl)-4,6-bis(trichloromethyl)-s-triazine, 2-p-phenyl-4,6-bis(trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2-4-trichloromethyl(piperonyl)-6-triazine, 2-4-trichloromethyl(4'-methoxystyryl)-6-triazine, and the like, and mixtures thereof.

In addition to these compounds, carbazole compounds, diketone compounds, sulfonium borate compounds, diazo compounds, imidazole compounds and biimidazole compounds may be used in the present invention.

Exemplary radical polymerization initiators useful in the present invention can include, without limitation, known peroxide type and azobis type initiators.

Examples of suitable peroxide type initiators can include, without limitation, ketone peroxides, such as methyl ethyl ketone peroxide, methyl isobutyl ketone peroxide, cyclohexanone peroxide, methyl cyclohexanone peroxide, acetyl acetone peroxide, and the like; diacyl peroxides, such as isobutyryl peroxide, 2,4-dichlorobenzoyl peroxide, o-methylbenzoyl peroxide, bis-3,5,5-trimethylhexanoylperoxide, and the like; hydroperoxides, such as 2,4,4,-trimethylpentyl-2-hydroperoxide, diisopropylbenzene hydroperoxide, cumene hydroperoxide, t-butylhydroperoxide, and the like; dialkyl peroxides, such as dicumyl peroxide, 2,5-dimethyl-2,5-di(t-butylperoxy)hexane, 1,3-bis(t-butyloxyisopropyl)benzene, t-butylperoxy n-butyl valerate, and the like; alkyl peresters, such as 2,4,4-trimethylpentylperoxyphenoxy acetate, α-cumylperoxy neodecanoate, t-butylperoxy benzoate di-t-butylperoxytrimethyl adipate, and the like; and percarbonates, such as di-3-methoxybutylperoxy dicarbonate, di-2-ethylhexylperoxy dicarbonate, bis-4-t-butylcyclohexylperoxy dicarbonate, diisopropylperoxy dicarbonate, acetylcyclohexylsulfonyl peroxide, t-butylperoxyaryl carbonate, and the like; as well as mixtures thereof. Examples of suitable azobis type initiators can include, without limitation, 1,1'-azobiscyclohexane-1-carbonitrile, 2,2'-azobis(2,4-dimethyl-valeronitrile), 2,2'-azobis(methylisobutyrate), 2,2'-azobis(4-methoxy-2,4-dimethylbaleronitrile), α,α-azobis(isobutylnitrile), 4,4'-azobis(4-cyanovaleric acid), and the like. These initiators may be used alone or as a mixture thereof.

The initiator may be used in combination with a photosensitizer.

The initiator can be present in the composition in an amount of about 0.1 to about 10% by weight. When the initiator is present in an amount of less than about 0.1% by weight, sufficient curing may not occur after formation of a pattern, resulting in low reliability. Meanwhile, when the initiator is present in an amount exceeding about 10% by weight, there may be problems in terms of resolution and adhesiveness.

Exemplary solvents useful in the invention can include, without limitation, ethylene glycol acetate, ethyl cellosolve, propylene glycol methyl ether acetate, ethyl lactate, polyethylene glycol, cyclohexanone, propylene glycol methyl ether, and the like. These solvents may be used alone or as a mixture thereof. The amount of the solvent used in the present invention can vary depending upon various factors as will be appreciated and understood by the skilled artisan, including the intended use of the photosensitive resin composition. Generally, the solvent can be used in an amount selected to allow the resin solution to have a viscosity sufficient to be applied to a substrate.

The resin composition of the present invention may further include at least one epoxy compound to improve the adhesiveness and other properties of the final color filter. Exemplary epoxy compounds useful in the invention can include, without limitation, phenol novolac epoxy resins, tetramethyl biphenyl epoxy resins, bisphenol A type epoxy resins, alicyclic epoxy resins, and the like, and mixtures thereof. The epoxy compound can be used in an amount of about 0.01 to about 5% by weight. When the epoxy compound is used in an amount of less than about 0.01% by weight, its addition effects are substantially negligible. Meanwhile, when the epoxy compound is used in an amount of more than about 5% by weight, there may be a problem in terms of storage properties and process margin.

The resin composition of the present invention may further include a pigment. The pigment may be an organic or inorganic pigment. Exemplary organic pigments useful in the present invention can include, without limitation, anthraquinone pigments, condensed polycyclic pigments (e.g., perylene pigments), phthalocyanine pigments, azo pigments, and the like. Exemplary inorganic pigments useful in the present invention can include, without limitation, carbon black, titanium, and the like. The organic and inorganic pigments may be used alone or as a mixture thereof. The pigment can be added in an amount of about 1 to about 20% by weight, for example, about 5 to about 10% by weight.

The resin composition of the present invention may further include a dispersant to improve the dispersibility of the pigment. The dispersant may be any of a non-ionic, anionic or cationic dispersant. Exemplary dispersants useful in the present invention can include, without limitation, polyalkylene glycols and esters thereof, polyoxyalkylene, alkylene oxide adducts of polyhydric alcohol esters, alcohol alkylene oxide adducts, sulfonic acid esters, sulfonic acid salts, carboxylic acid esters, carboxylic acid salts, alkyl amide alkylene oxide adducts, alkyl amines, and the like. These dispersants may be used alone or in any combination thereof. The dispersant can be used in an amount of about 0.1 to about 10 parts by weight, based on 100 parts by weight of the pigment.

So long as the physical properties of the composition according to the present invention are not damaged, at least one additive selected from surfactants, antioxidants and stabilizers may be added to the composition of the present invention.

The resin composition of the present invention can be used to produce a color filter of a liquid crystal display device, in accordance with the following procedure.

Application

The photosensitive resin composition of the present invention is applied to a thickness of 0.5 to 10 μm to a glass substrate by an appropriate technique, such as spin coating, roll coating or spraying.

Light Exposure

The applied resin composition is irradiated with actinic rays to form a pattern necessary for a color filter. As a light source for the irradiation, UV light in the range of 200 nm to 400 nm is used. Electron beams and X rays may be used for the irradiation.

Development

The irradiated coating film is treated with a developing solution to dissolve the unexposed portion of the coating film and to form a pattern necessary for a color filter.

Repetition

The above procedure may be repeated depending on the intended number of colors to form a desired pattern.

Additional Step

The image pattern obtained after the development may be cured by any treatment, such as heating or irradiation with actinic rays, to form a pattern having advantages in terms of light resistance, adhesiveness, crack resistance, chemical resistance, high strength, high angle gradient to 90° and storage stability.

Hereinafter, the present invention will be explained in more detail with reference to the following examples. However, these examples are given for the purpose of illustration only and are not intended to limit the scope of the invention.

EXAMPLES

Example 1

The following cardo resin of Formula 2 and the components in the respective amounts shown in Table 1 are used to prepare a resin composition.

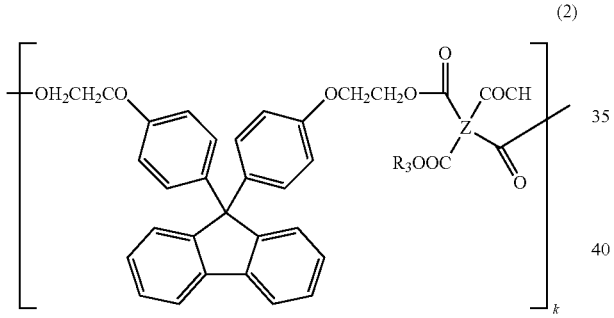

(2)

wherein $R_3$ is a methacryl group, and Z is the residue of 3,3',4,4'-benzophenonetetracarboxylic dianhydride. (k is 25)

TABLE 1

| Components | Content (wt %) |
|---|---|
| Cardo resin | 5 |
| Propylene glycol monomethyl ether | 30 |
| Dipropylene glycol ethyl methyl ether | 17 |
| Dipentaerythritol triacrylate | 2 |
| Irgacure 369 (Ciba-Geigy) | 1 |
| 4.4'-Dimethylbenzophenone | 0.5 |
| CI-M-050 (Sakata Inx Corp.) | 44 |
| Coupling agent (Methacryloxysilane, Chisso) | 0.2 |
| Fluorinated surfactant (F-475, DIC) | 0.3 |
| Total | 100 |

Example 2

The cardo resin of Formula 2 used in Example 1 and the components in the respective amounts shown in Table 2 are used to prepare a resin composition.

TABLE 2

| Components | Content (wt %) |
|---|---|
| Cardo resin | 7 |
| Propylene glycol monomethyl ether | 65 |
| Cyclohexanone | 15 |
| Dipentaerythritol triacrylate | 5.5 |
| TAZ-110 (Midori Kagaku Co., Ltd.) | 0.6 |
| Irgacure 907 (Ciba-Geigy) | 0.2 |
| 4,4'-Bis(diethylamino)benzophenone (Hodogaya Chemical Co., Ltd.) | 0.6 |
| Diketo-Pyrrollo-Pyrole Red | 6 |
| Fluorinated surfactant (F-475, DIC) | 0.1 |
| Total | 100 |

Example 3

A resin composition is prepared in the same manner as in Example 2, except that a mixture of C.I. Pigment Green 36 and C.I. Pigment Yellow 150 (75/25) is used instead of Diketo-Pyrrollo-Pyrrole Red.

Example 4

A resin composition is prepared in the same manner as in Example 2, except that a mixture of C.I. Pigment Blue 15:6 and C.I. Pigment Purple 23 (90/10) is used instead of Diketo-Pyrrollo-Pyrrole Red.

Example 5

The cardo resin of Formula 2 used in Example 1 and the components in the respective amounts shown in Table 3 are used to prepare a resin composition.

TABLE 3

| Components | Content (wt %) |
|---|---|
| Cardo resin | 2.3 |
| Acrylic resin | 18.54 |
| Propylene glycol monomethyl ether | 63 |
| Cyclohexanone | 9 |
| Dipentaerythritol triacrylate | 2.9 |
| Glycerol triacrylate | 2.4 |
| Irgacure 369 (Ciba-Geigy) | 1.2 |
| 3-Trimethoxysilylpropyl methacrylate | 0.66 |
| Total | 100 |

Comparative Example 1

A resin composition is prepared in the same manner as in Example 1, except that an acrylic resin (benzylmethacrylate:methacrylic acid=30:70) is used instead of the cardo resin of Formula 2.

Comparative Example 2

A resin composition is prepared in the same manner as in Example 1, except that a cardo copolymer resin (V259ME, Nippon Steel Chemical Co., Ltd.) is used instead of the cardo resin of Formula 2.

The resin compositions prepared in Examples 1 to 5 and Comparative Examples 1 and 2 are used to form respective patterns. The physical properties of the patterns are evaluated in accordance with the following procedures. The results are shown in Table 4.

[Evaluation of Physical Properties of Patterns]

1) Developability

First, a 1.2 mm-thick glass substrate is degreased and washed. Each of the resin compositions prepared in Examples 1 to 5 and Comparative Examples 1 and 2 is applied to a thickness of 1 to 2 μm to the washed glass substrate, followed by drying on a hot plate at 80° C. for one minute to form a coating film. Subsequently, the coating film is placed in contact with a photomask, irradiated using a high-pressure mercury lamp having a wavelength of 365 nm through the photomask, developed with a 1% aqueous KOH solution under ambient pressure at 30° C. for 100 seconds, and dried in a hot-air circulating drier at 220° C. for 40 minutes to form a pattern. The patternability of the pattern is evaluated using an optical microscope, based on the following criteria:

O: No residual film is observed on the pattern and the unexposed glass substrate Δ: Residual film is slightly observed on the pattern but no residual film is observed on the unexposed glass substrate x: Residual film is observed on both the pattern and the unexposed glass substrate 2) Heat Resistance First, a 1 mm-thick glass substrate is degreased and washed. Each of the resin compositions prepared in Examples 1 to 5 and Comparative Examples 1 and 2 is applied to a thickness of 1 to 2 μm to the washed glass substrate, followed by drying on a hot plate at 80° C. for one minute to form a coating film. Subsequently, the coating film is placed in contact with a photomask, irradiated using a high-pressure mercury lamp having a wavelength of 365 nm through the photomask, developed with a 1% aqueous KOH solution under ambient pressure at 30° C. for 100 seconds, and dried in a hot-air circulating drier at 220° C. for 40 minutes to form a pattern. The patternability of the pattern is evaluated using an optical microscope.

After the pattern is heated at 220° C. for 3 hours, changes of the pattern are observed and the difference in the thickness of the pattern is measured. The heat resistance of the pattern is evaluated, based on the following criteria:

O: No change is observed and the difference in the thickness ($\Delta T$) is smaller than 0.30 μm Δ: Slight changes are observed and the thickness difference ($\Delta T$) is between 0.30 μm and 0.50 μm x: Considerable changes are observed and the thickness difference ($\Delta T$) is larger than 0.50 μm

* Changes of the pattern indicate swelling of the pattern and occurrence of recrystallization on the surface of the pattern 3) Uniformity First, a 1 mm-thick chromium-coated glass substrate is degreased and washed. Each of the resin compositions prepared in Examples 1 to 5 and Comparative Examples 1 and 2 is applied to a thickness of 1 to 2 μm to the washed glass substrate, followed by drying on a hot plate at 80° C. for one minute to form a coating film. Subsequently, the coating film is placed in contact with a photomask, irradiated using a high-pressure mercury lamp having a wavelength of 365 nm through the photomask, developed with a 1% aqueous KOH solution under ambient pressure at 30° C. for 100 seconds, and dried in a hot-air circulating drier at 220° C. for 40 minutes to form a pattern. The difference in the height of the pattern on the substrate is measured. The uniformity of the pattern is evaluated, based on the following criteria:

O: The height difference ($\Delta H$) is smaller than 0.2 μm

Δ: The height difference ($\Delta H$) is between 0.2 and 0.3 μm x: The height difference ($\Delta H$) is larger than 0.3 μm 4) Adhesiveness First, a 1 mm-thick chromium-coated glass substrate is degreased and washed. Each of the resin compositions prepared in Examples 1 to 5 and Comparative Examples 1 and 2 is applied to a thickness of 1 to 2 μm to the washed glass substrate, followed by drying on a hot plate at 60° C. for one minute to form a coating film. Subsequently, the coating film is placed in contact with a photomask, irradiated using a high-pressure mercury lamp having a wavelength of 365 nm through the photomask, developed with a 1% aqueous KOH solution under ambient pressure at 30° C. for 100 seconds, and dried in a hot-air circulating drier at 220° C. for 40 minutes to form a pattern. Changes of the pattern are observed after washing the pattern with water such that the water-washing pressure is varied to 5 Kgf/cm² or above. The adhesiveness of the pattern is evaluated, based on the following criteria:

O: No peeling of the pattern is observed at a water-washing pressure of 5 kgf/cm² or above Δ: Peeling of the pattern is slightly observed at a water-washing pressure of 5 kgf/cm² or above x: Considerable peeling of the pattern is observed at a water-washing pressure of 5 kgf/cm² or above.

TABLE 4

| | Physical properties | | | |
| --- | --- | --- | --- | --- |
| | Developability | Heat resistance | Uniformity | Adhesiveness |
| Example 1 | O | O | O | O |
| Example 2 | O | O | O | O |
| Example 3 | O | O | O | O |
| Example 4 | O | O | O | O |
| Example 5 | O | O | O | O |
| Comparative Example 1 | Δ | X | Δ | Δ |
| Comparative Example 2 | O | O | O | Δ |

As can be seen from the experimental results of Table 4, the resin compositions prepared in Examples 1 to 5 show better results in every evaluation criterion. In contrast, the resin composition of Comparative Example 1, which is prepared using an acrylic resin (benzylmethacrylate:methacrylic acid=30:70) instead of the cardo resin of Formula 2, and the resin composition of Comparative Example 2, which is prepared using a cardo copolymer resin (V259ME, Nippon Steel Chemical Co., Ltd.) instead of the cardo resin of Formula 2, are found to have poor adhesiveness. The resin composition of Comparative Example 1 show poor results in the evaluation of the four physical properties. Particularly, the pattern formed using the resin composition of Comparative Example 1 show considerable changes and a large thickness difference, indicating poor heat resistance.

As apparent from the foregoing, the present invention can provide a resin composition comprising a cardo resin and a method for preparing a material for a color filter using the resin composition. According to the present invention, the resin composition can be used to produce a display color filter with excellent physical properties (e.g., high resolution, good adhesiveness and high film strength) and high reliability in terms of heat resistance, light resistance, chemical resistance, transparency and stability over time.

Many modifications and other embodiments of the invention will come to mind to one skilled in the art to which this invention pertains having the benefit of the teachings presented in the foregoing descriptions. Therefore, it is to be That which is claimed is:

1. A resin composition comprising a cardo resin with a structural unit represented by Formula 1:

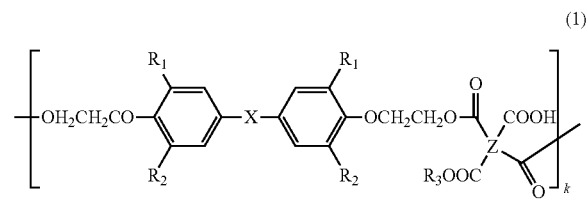

wherein:
each $R_1$ and $R_2$ is independently a hydrogen atom, a halogen atom or a $C_1$-$C_5$ alkyl group,
$R_3$ is a vinyl, acryl or methacryl group,
Z represents the residue of an acid anhydride or dianhydride,
X is —CO—, —SO$_2$—, —C(CF$_3$)$_2$—, —Si(CH$_3$)$_2$—, —CH$_2$—, —C(CH$_3$)$_2$—, —O—,

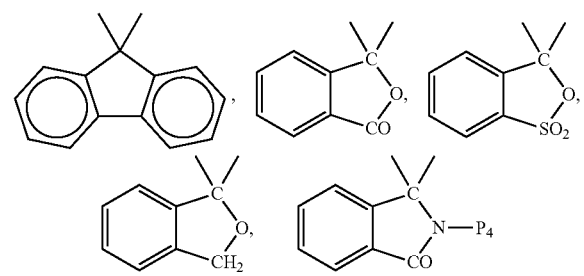

(wherein $R_4$ is hydrogen, ethyl, —C$_2$H$_4$Cl, —C$_2$H$_4$OH, —CH$_2$CH=CH$_2$ or phenyl),

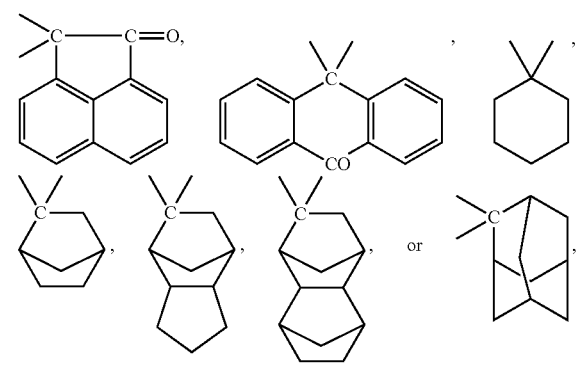

and
k is integer from 1 to 40.

2. The resin composition according to claim 1, wherein the composition further comprises a reactive unsaturated compound, an initiator, and a solvent.

3. The resin composition according to claim 2, wherein the composition comprises (a) about 1 to about 30% by weight of the cardo resin, (b) about 1 to about 30% by weight of the reactive unsaturated compound, (c) about 0.1 to about 10% by weight of the initiator, and (d) the balance of the solvent.

4. The resin composition according to claim 1, wherein the cardo resin has a molecular weight ($M_w$) of about 3,000 to about 20,000.

5. The resin composition according to claim 2, wherein the initiator comprises an initiator selected from photopolymerization initiators, radical polymerization initiators, and mixtures thereof.

6. The resin composition according to claim 1, further comprising at least one epoxy compound selected from phenol novolac epoxy resins, tetramethyl biphenyl epoxy resins, bisphenol A type epoxy resins, alicyclic epoxy resins, and mixtures thereof.

7. The resin composition according to claim 6, wherein the epoxy compound is used in an amount of about 0.01 to about 5% by weight.

8. The resin composition according to claim 1, further comprising at least one pigment selected from anthraquinone pigments, condensed polycyclic pigments, including perylene pigments, phthalocyanine pigments, azo pigments, carbon black, titanium, and mixtures thereof.

9. The resin composition according to claim 8, wherein the pigment is added in an amount of about 1 to about 20% by weight.

10. The resin composition according to claim 1, further comprising at least one dispersant selected from polyalkylene glycols and esters thereof, polyoxyalkylene, alkylene oxide adducts of polyhydric alcohol esters, alcohol alkylene oxide adducts, sulfonic acid esters, sulfonic acid salts, carboxylic acid esters, carboxylic acid salts, alkyl amide alkylene oxide adducts, alkyl amines, and mixtures thereof.

11. The resin composition according to claim 10, wherein the dispersant is used in an amount of about 0.1 to about 10 parts by weight, based on 100 parts by weight of the pigment.

12. A method for preparing a material for a color filter, the method comprising the steps of:
(a) applying a resin composition comprising a cardo resin with a structural unit represented by Formula 1:

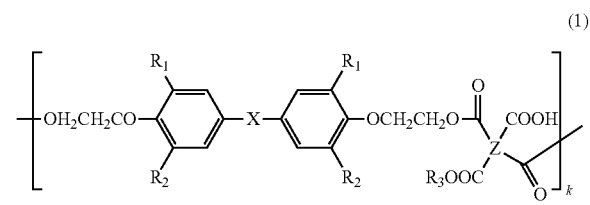

wherein:
each $R_1$ and $R_2$ is independently a hydrogen atom, a halogen atom or a $C_1$-$C_5$ alkyl group,
$R_3$ is a vinyl, acryl or methacryl group,
Z represents the residue of an acid anhydride or dianhydride,
X is —CO—, —SO$_2$—, —C(CF$_3$)$_2$—, —Si(CH$_3$)$_2$—, —CH$_2$—, —C(CH$_3$)$_2$—, —O—,

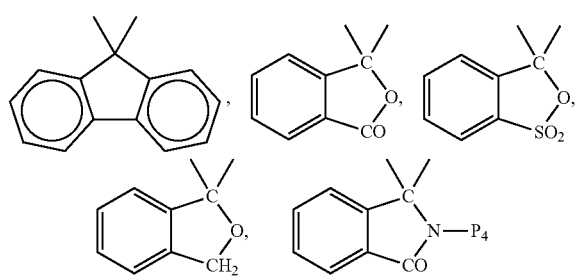

(wherein R₄ is hydrogen, ethyl, —C₂H₄Cl, —C₂H₄OH, —CH₂CH=CH₂ or phenyl),

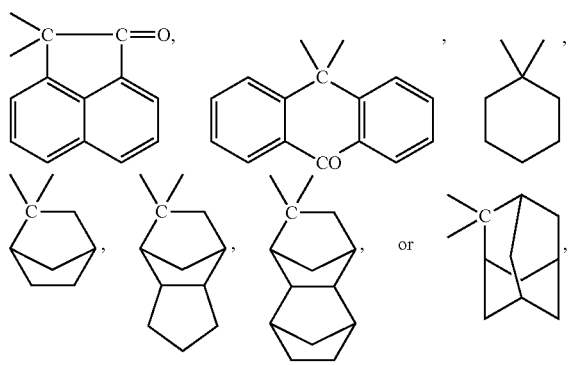

and k is integer from 1 to 40 to a thickness of 0.5 to 10 μm to a substrate;

(b) irradiating the resin composition with UV rays or X rays in the range of about 190 nm to about 450 nm to form a coating film; and (c) treating the coating film with a developing solution to form a pattern.

13. A color filter comprising a material prepared by the method according to claim 12.

14. The resin composition according to claim 1, wherein Z in Formula 1 represents the residue of an acid anhydride selected from the group consisting of methylendomethylenetetrahydrophthalic anhydride, chlorendic anhydride, methyltetrahydrophthalic anhydride, and mixtures thereof.

15. The resin composition according to claim 1, wherein Z in Formula 1 represents the residue of an acid dianhydride selected from the group consisting of pyromellitic anhydride, benzophenonetetracarboxylic dianhydride, biphenyltetracarboxylic dianhydride, biphenylethertetracarboxylic dianhydride, and mixtures thereof.

16. The resin composition according to claim 1, wherein the cardo resin is selected from the group consisting of 3,3-bis(4-hydroxyphenyl)-2-benzofuran-1(3H)-one, 3,3-bis(4-hydroxy-3-methylphenyl)-2-benzofuran-1(3H)-one, 3,3-bis(4-hydroxy-2,5-dimethylphenyl)-2-benzofuran-1(3H)-one, 3,3-bis(4-hydroxy-1-naphthyl)-2-benzofuran-1(3H)-one, 3,3-bis(4-hydroxy-5-isopropyl-2-methylphenyl)-2-benzofuran-1(3H)-one, 3,3-bis(3,5-dibromo-4-hydroxyphenyl)-2-benzofuran-1(3H)-one, 3,3-bis(4-hydroxy-3,5-diiodophenyl)-2-benzofuran-1(3H)-one, 9,9-bis(4-hydroxyphenyl)-10-anthrone, 1,2-bis(4-carboxyphenyl)carborane, 1,7-bis(4-carboxyphenyl)carborane, 2-bis(4-carboxyphenyl)-N-phenylphthalimidine, 3,3-bis(4'-carboxyphenyl)phthalide, 9,10-bis-(4-aminophenyl)-anthracene, anthrone dianiline, aniline phthalein, and mixtures thereof.

17. The resin composition according to claim 1, wherein the cardo resin has a structural unit represented by Formula 2:

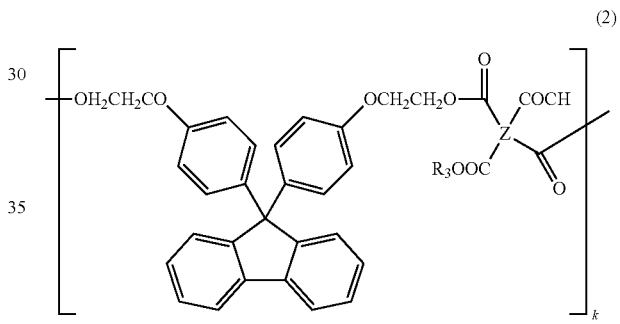

(2)

wherein R₃ is a methacryl group, Z is the residue of 3,3',4,4'-benzophenonetetracarboxylic dianhydride, and k is 25.

* * * * *

UNITED STATES PATENT AND TRADEMARK OFFICE
CERTIFICATE OF CORRECTION

PATENT NO.        : 8,216,770 B2
APPLICATION NO.   : 11/747313
DATED             : July 10, 2012
INVENTOR(S)       : Hee Young Oh et al.

It is certified that error appears in the above-identified patent and that said Letters Patent is hereby corrected as shown below:

In the Specification

Column 9, Lines 30-43, cardo resin of Formula 2 is depicted as:

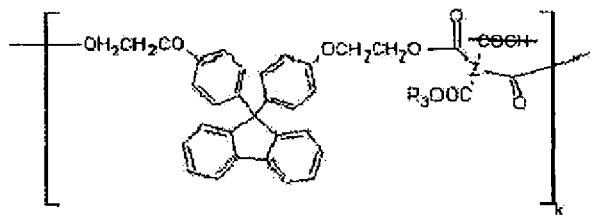

and should be depicted as:

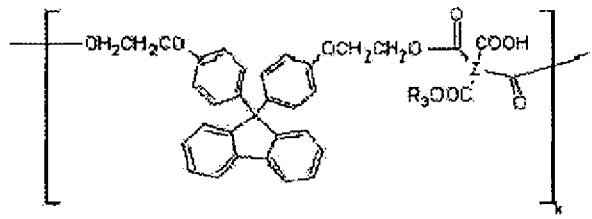

Signed and Sealed this
Sixth Day of November, 2012

David J. Kappos
*Director of the United States Patent and Trademark Office*

CERTIFICATE OF CORRECTION (continued)
U.S. Pat. No. 8,216,770 B2

In the Claims

Column 16, Claim 17, Lines 27-40, cardo resin of Formula 2 is depicted as:

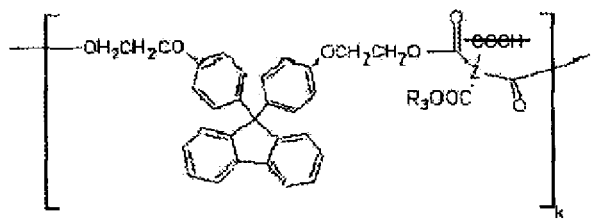

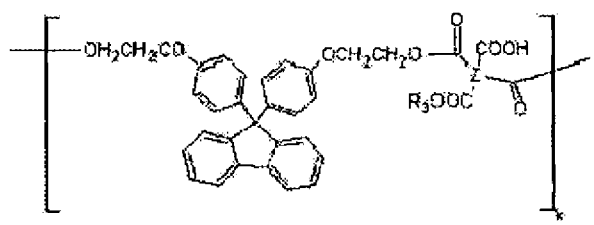

and should be depicted as: